United States Patent
Fiocchi et al.

(10) Patent No.: US 7,855,602 B2
(45) Date of Patent: Dec. 21, 2010

(54) AMPLIFIER ARRANGEMENT AND SIGNAL GENERATION METHOD

(75) Inventors: Carlo Fiocchi, Belgioioso (IT); Andrea Pierin, Canneto Pavese (IT)

(73) Assignee: Austriamicrosystems AG, Unterpremstätten (AT)

( * ) Notice: Subject to any disclaimer, the term of this patent is extended or adjusted under 35 U.S.C. 154(b) by 0 days.

(21) Appl. No.: 12/418,221

(22) Filed: Apr. 3, 2009

(65) Prior Publication Data

US 2009/0251219 A1    Oct. 8, 2009

(30) Foreign Application Priority Data

Apr. 8, 2008    (EP) .................... 08006985

(51) Int. Cl.
*H03F 1/14* (2006.01)

(52) U.S. Cl. .................. 330/292; 330/310; 330/100

(58) Field of Classification Search .......... 330/292, 330/310, 100
See application file for complete search history.

(56) References Cited

U.S. PATENT DOCUMENTS

| | | | | |
|---|---|---|---|---|
| 5,640,128 A | * | 6/1997 | Wilhelm | 330/308 |
| 7,239,202 B1 | | 7/2007 | Aram et al. | |
| 7,366,427 B2 | * | 4/2008 | Li | 398/195 |
| 7,423,483 B1 | * | 9/2008 | Voo | 330/109 |
| 7,605,649 B2 | * | 10/2009 | Sutardja | 330/98 |
| 2004/0164789 A1 | * | 8/2004 | Leung et al. | 327/546 |
| 2007/0242796 A1 | | 10/2007 | Vengrinovich et al. | |
| 2008/0001585 A1 | | 1/2008 | Bakkaloglu et al. | |

* cited by examiner

*Primary Examiner*—Patricia Nguyen
(74) *Attorney, Agent, or Firm*—Cohen Pontani Lieberman & Pavane LLP

(57) ABSTRACT

An amplifier arrangement includes an output amplifier stage (OA) comprising a stage input (SIN), a stage output (SOUT) which is coupled to a signal output (OUT) of the amplifier arrangement, and a capacitive element (CE) which couples the stage output (SOUT) to the stage input (SIN). A driver stage (DR) comprises a driver input (DIN) and a driver output (DOUT) which is coupled to the stage input (SIN). The driver stage (DR) is configured to generate a voltage potential at a driver output (DOUT) depending on an input current at the driver input (DIN) and to provide a charging current to the capacitive element (CE) being higher than the input current.

12 Claims, 2 Drawing Sheets

AMPLIFIER ARRANGEMENT AND SIGNAL GENERATION METHOD

RELATED APPLICATION

This application claims the priority of European application no. 08006985.9 filed Apr. 8, 2008, the entire content of which is hereby incorporated by reference.

FIELD OF THE INVENTION

The invention relates to an amplifier arrangement with a capacitive compensation and to a signal generation method with an amplifier stage with a capacitive compensation.

BACKGROUND OF THE INVENTION

In some amplifier applications it is desirable to reduce or limit the bandwidth of an amplifier or an amplifier stage for a reduction of noise. To this end, compensating capacitors can by applied which may couple an input of the amplifier stage to its output, for example. Such a compensation can also be called a Miller compensation.

An exemplary application where such low bandwidth amplifiers can be used is a linear voltage regulator. For example, in a low dropout regulator, LDO, a low gain bandwidth can be chosen to achieve a desired noise reduction. As usually no alternating signal is generated by such a structure, a small bandwidth does not present any drawback.

However, during startup of a capacitive compensated amplifier, the initial charging of the capacitance can lead to a slew rate limitation. In other words, a conventional amplifier with a capacitive compensating scheme can have a startup time in which it may not be fully functional.

SUMMARY OF THE INVENTION

It is an object of the invention to provide an amplifier arrangement and a signal generation method with reduced startup time resulting from capacitive compensated amplifiers while achieving adequate noise reduction.

In one exemplary embodiment an amplifier arrangement comprises an output amplifier stage comprising a stage input, a stage output which is coupled to a single output of the amplifier arrangement, and a capacitive element coupling the stage output to the stage input. The amplifier arrangement further comprises a driver stage comprising a driver input and a driver output which is coupled to the stage input. The driver stage is configured to generate a voltage potential at the driver output depending on an input current at the driver input and to provide a charging current to the capacitive element being higher than the input current.

During operation of the amplifier arrangement, a voltage across the capacitive element is determined by the charge stored in the capacitive element such that without charging or discharging the capacitive element that voltage remains mainly unchanged. Therefore, the bandwidth of a transfer function between an input signal and an output signal of the output amplifier stage is limited.

If input and output voltage at the stage input and the stage output, respectively, change, the voltage across the capacitive element changes accordingly, wherein a time for changing, in other words the slew rate, depends on a current provided at the stage input. In the embodiment of the amplifier arrangement, a driver voltage is generated by the driver stage depending on the input current provided to the driver stage. When generating the driver voltage, a charging current is provided to the driver output and therefore to the capacitive element which charges or discharges, respectively, the capacitive element according to the changed voltage potentials. As the charging current is provided with a current value being higher than a value of the input current, the slew rate of the amplifier arrangement is increased compared to a conventional amplifier arrangement in which the capacitive element is directly charged or discharged by the input current.

As at a startup of the amplifier arrangement a voltage across the capacitive element usually is changing significantly, a reduced charging time for an initial charging reduces the startup time of the amplifier arrangement.

In one embodiment, the output amplifier stage comprises an output transistor and an amplifier element whose input is coupled to the stage input and whose output is coupled to a control input of the output transistor. A controllable path of the output transistor is coupled between a supply potential terminal and the stage output.

Depending on a voltage at stage input, the amplifier element generates a control voltage or a control current at its output which controls the controllable path of the output transistor. In other words, a resistance of a connection between the supply potential terminal and the stage output is controlled by the amplifier element. Therefore, an output voltage is derived from a supply voltage at the supply potential terminal.

The amplifier element may be a comparison element for comparing the voltage at its input to a reference voltage, for example a virtual ground voltage provided independently or determined by circuit parameters. For example, the reference voltage is determined by a threshold voltage of a transistor amplifier.

The driver stage which provides the higher charging current may be embodied as a transimpedance amplifier which generates an output voltage depending on an input current. For example, the driver stage comprises a further amplifier element which is coupled between the driver input and the driver output and comprises an impedance based feedback, for example a resistive feedback. To this end, the driver input may be coupled to the driver output by a feedback resistor.

In one embodiment, the driver stage comprises a driver current source coupled between the supply potential terminal and the driver output. The driver stage further comprises a driver transistor whose controllable path is coupled between the driver output and the ground potential terminal and whose control input is coupled to the driver input. In this embodiment, an impedance element is coupled between the driver input and the driver output.

With this embodiment of the driver stage, the driver voltage is derived from the supply voltage by controlling the driver transistor, wherein the charging current is provided by the driver current source. Through the feedback by the impedance element, the driver transistor is controlled such that the driver voltage is derived from the input current.

In this embodiment, the charging current is provided to the capacitive element. In another embodiment, the driver current source can also be arranged between the driver output and the ground potential terminal while the controllable path of the driver transistor is coupled between the supply potential terminal and the driver output. In this case, a negative current is provided to the capacitive element which can act as a discharging current. In other words, the driver stage can comprise a series connection of the driver current source and the driver transistor, the series connection being coupled between the supply potential terminal and the ground potential terminal, wherein a connection between the driver transistor and the driver current source forms the driver output.

In a further embodiment of an amplifier arrangement, a driver stage further comprises a further driver current source connected in parallel to the driver current source in a switchable fashion depending on an activation signal. A further driver transistor is connected in parallel to the driver transistor in a switchable fashion depending on the activation signal accordingly. In other words, the controllable path of the further driver transistor is connected in parallel to the controllable path of the driver transistor and the control connections of the driver transistor and further driver transistor are coupled together.

The further driver transistor and the further current source are connected in series, wherein switches are provided for a connection to the supply potential terminal and the ground potential terminal. The switches can be controlled by the activation signal.

The further driver transistor and the further driver current source may be matched to the driver transistor and the driver current source such that currents through the further elements increase or decrease proportionally to the currents through the fixed elements, namely the driver current source and the driver transistor, depending on the input current. For example, there is a fixed current ratio between the further elements and the fixed elements which preferably is higher than one. Therefore, by activating the further elements, an even higher charging current can be provided at the driver output. For example, further elements are activated during a startup phase of the amplifier arrangement by a separate control circuit. This further increases the slew rate of the amplifier arrangement and reduces its startup time.

In a further embodiment, the driver stage comprises a further impedance element connected in series to the impedance element in a switchable fashion depending on a further activation signal. For example, the further impedance element is connected in series to the impedance element of the driver stage and can be bypassed by a switch which is activated or deactivated, respectively, by the further activation signal.

The increased resistance value of the resistive feedback can also increase the charging current provided to the capacitive element for reducing the startup time.

The embodiment with the further impedance element and the embodiment with the further driver current source and the further driver transistor can be used alternatively or in combination. In the latter case, the same activation signal can be used.

In one embodiment of an amplifier arrangement, the amplifier element of the output amplifier stage comprises an output current source being matched to the driver current source and a transistor being matched to the driver transistor, wherein a controllable path of the transistor is connected in series to the output current source and a control connection of the transistor is coupled to the stage input. An inverter element couples the control input of the output transistor in a connection of the output current source and the transistor of the amplifier element. For example, the series connection of the output current source and the controllable path of the transistor is coupled between the supply potential terminal and the ground potential terminal. The inverter element can also comprise an amplification stage and therefore be regarded as an inverting amplification stage.

If the driver current source is coupled between the supply potential terminal and the driver output, preferably, the output current source is also coupled between the supply potential terminal and an input of the inverter element.

By matching the transistors and current sources of the driver stage and the amplifier element of the output stage, same input signals to the respective stages result basically to similar output signals. Accordingly, in a steady state of the amplifier arrangement, a current flow across the resistive feedback of the driver stage can be avoided. In other words, no systematic offset is present at the input of the output amplifier stage for this case.

In one embodiment, the amplifier arrangement further comprises a differential stage with a reference input for providing a reference voltage, a comparison input coupled to the signal output and a comparison output coupled to the driver input. The differential stage is configured to provide a comparison current at the comparison output depending on a comparison of a voltage of the comparison input and the reference voltage.

As the output voltage of the amplifier arrangement is fed back to the comparison input of the differential stage for comparing it to the reference voltage, the output voltage is controlled by the amplifier arrangement such that it is basically equal to the reference voltage. The amplifier arrangement with the differential stage can therefore be used as a linear voltage regulator or a low dropout regulator.

As the output current or tail current of the differential stage usually is limited in a voltage regulator, it is not sufficient to directly charge the capacitive element with a desired slew rate. Accordingly, the output current of the differential stage is increased by means of the driver stage such that a voltage regulator can be achieved having an adequate noise performance and a short startup time.

In an exemplary embodiment of the signal generation method, an output amplifier stage is provided whose output is coupled to its input via a capacitive element. An input current is provided and a driver voltage is generated depending on the input current. Generating the driver voltage includes providing a charging current to the capacitive element being higher than the input current. An output voltage is generated depending on the driver voltage by means of the output amplifier stage.

Accordingly, the charging, in particular a charging time of the capacitive element is not solely dependent on a direct charging with the input current because an additional charging current is generated depending on the input current. Therefore, the capacitive element can be charged faster.

In one embodiment, the output voltage is generated by controlling a current through an output transistor, which is coupled to a supply potential terminal as a function of the driver voltage.

In one embodiment, generating the driver voltage selectively comprises increasing the charging current depending on an activation signal. For example, during a startup phase, an activation signal can be provided which results in an increasing of the charging current during the startup phase. Therefore, the startup time can further be reduced.

In one embodiment, generating the driver voltage is based on a resistive feedback. For example, the driver voltage can be generated by means of a transimpedance stage.

In one embodiment, the driver voltage is generated by selectively increasing the resistance of the resistive feedback depending on a further activation signal. As by the increased resistance of the resistive feedback the charging current is increased, also in this embodiment the startup time can be further reduced.

In one embodiment, the input current is provided by comparing the output voltage to a reference voltage. Therefore, the output voltage is generated in a control loop depending on the reference voltage.

BRIEF DESCRIPTION OF THE DRAWINGS

The text below explains the invention in detail using exemplary embodiments with reference to the drawings. Like reference numerals designate corresponding similar parts or elements. In the drawings.

DETAILED DESCRIPTION OF THE DRAWINGS

Figure 1:
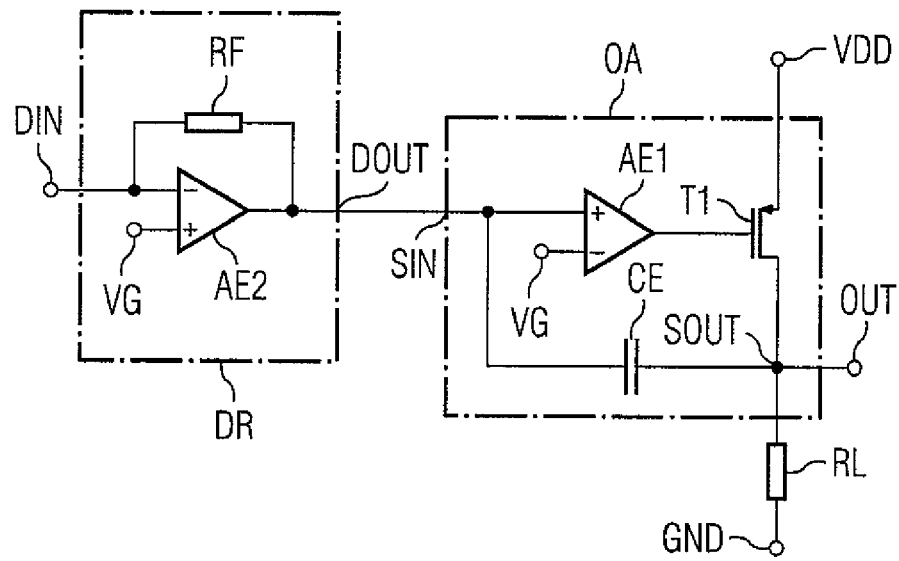
FIG. 1 shows a first exemplary embodiment of an amplifier arrangement.

FIG. 1 shows an embodiment of an amplifier arrangement with a driver stage DR and an output amplifier stage OA. The driver stage DR comprises a driver input DIN and a driver output DOUT which are coupled by an amplifier element AE2. In particular, an inverting input of the amplifier element AE2 is coupled to the driver input DIN and an output of the amplifier element AE2 is coupled to the driver output DOUT. The driver stage DR comprises a resistive feedback which is provided by an impedance element RF coupling the driver input DIN to the driver output DOUT. A non-inverting input of the amplifier element AE2 is coupled to a terminal VG for providing a virtual ground potential.

The output amplifier stage OA comprises a stage input SIN with is coupled to the driver output DOUT. Furthermore, an amplifier element AE1 and an output transistor T1 are comprised by the output amplifier stage OA. A non-inverting input of the amplifier element AE1 is coupled to the stage input SIN, whereas the inverting input of the amplifier element AE1 is coupled to the terminal VG. An output of the amplifier element AE1 is coupled to the control connection of the transistor T1 which in this embodiment is formed by a p-channel field-effect transistor. A controllable path of the transistor T1 is coupled between a supply potential terminal VDD and a stage output SOUT of the output amplifier stage OA. A capacitive element CE couples the stage output SOUT to the stage input SIN. A signal output OUT of the amplifier arrangement is coupled to the stage output SOUT. A load can be connected to the signal output OUT which in the drawing is exemplarily shown as a resistive load RL coupled between a signal output OUT and a ground potential terminal GND.

The driver stage DR works as a transimpedance stage in which an input current provided at the driver input DIN is converted to an output voltage at driver output DOUT. To this end, the driver voltage is determined by a voltage drop across the resistive feedback RF in response to the input current and on the virtual ground voltage. However, the amplifier element AE2 is able to provide an output current to the driver output DOUT which is higher than the input current. The higher output current is used as a charging current for the capacitive element CE in the output amplifier stage OA to change the voltage across the capacitive element CE. In other words, a charge stored in the capacitive element can be changed by the charging current in a faster way than it would be possible with the input current.

The driver voltage is further used to generate a control voltage for controlling the output transistor T1 by means of the amplifier element AE1. By controlling the controllable path of the output transistor T1, a resistance between the signal output OUT and the supply voltage terminal can be adjusted such that depending on a voltage drop across the output transistor T1, the output voltage results. By means of the capacitive element CE, the bandwidth of the output amplifier stage is limited and a low gain bandwidth product is achieved. Accordingly, the output amplifier stage OA is less sensitive to noise and the noise performance of the amplifier arrangement is improved.

Figure 2:
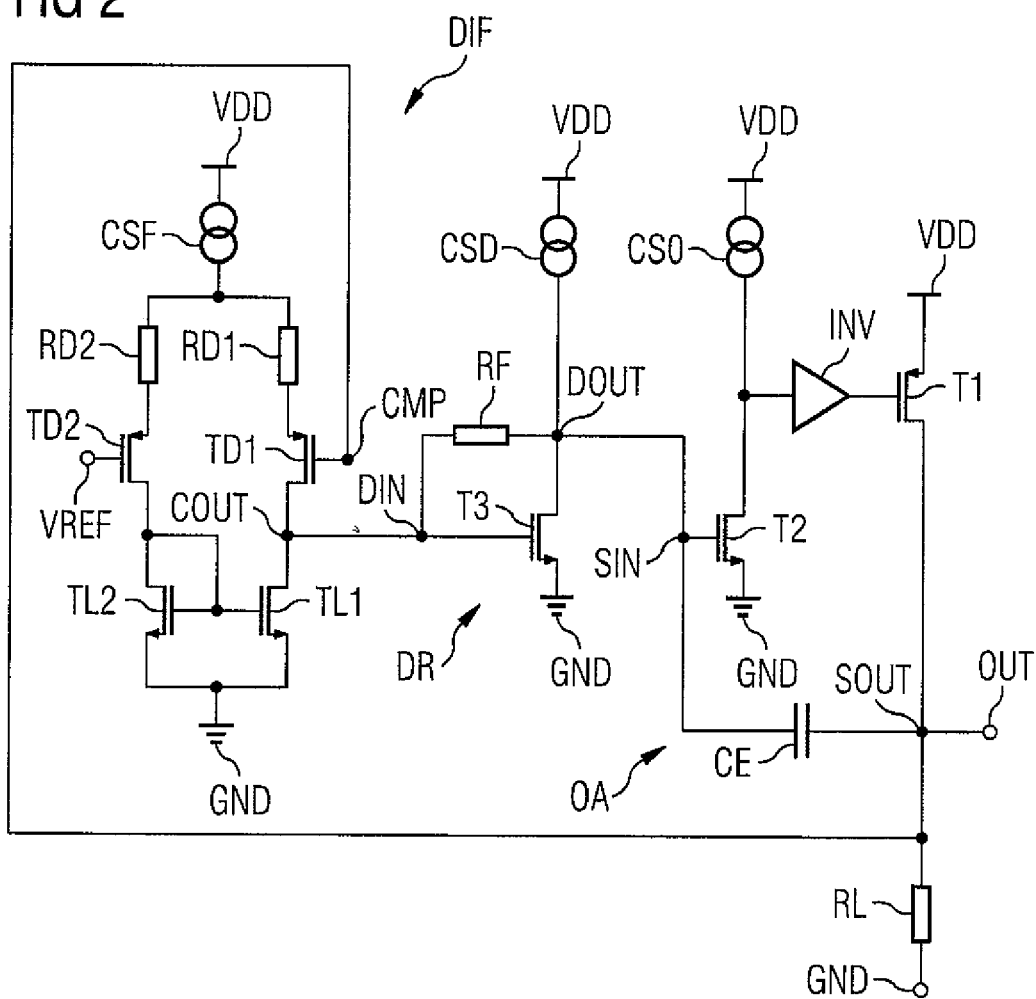
FIG. 2 shows a second exemplary embodiment of an amplifier arrangement.

FIG. 2 shows another embodiment of an amplifier arrangement which further to a driver stage DR and an output amplifier stage OA comprises a differential stage DIF. The differential stage DIF comprises a pair of input transistors TD1, TD2 which are connected in series to respective resistors RD1, RD2. The differential stage further comprises a common current source CSF for the two signal paths and an active load in form of load transistors TL1, TL2 which are connected as a current mirror. The control input of the first transistor TD1 is coupled to a comparison input CMP of the differential stage which is coupled to the signal output OUT and the stage output SOUT, respectively. The control input of the second transistor TD2 is coupled to a reference input VREF. In this embodiment, the pair of input transistors TD1, TD2 is embodied with p-channel field-effect transistors whereas the active load TL1, TL2 comprises n-channel field-effect transistors. A comparison output COUT between the first transistor TD1 and the first load transistor TL1 is coupled to the driver input DIN of the driver stage.

In this embodiment, the driver stage DR comprises a series connection of a driver current source CSD and a driver transistor T3 which is coupled between the supply voltage terminal VDD and the ground potential terminal GND. A connection of driver transistor T3 and driver current source CSD forms the driver output DOUT. The driver transistor T3 and the driver current source CSD form the amplifier element AE2 shown in FIG. 1, wherein the control input of the driver transistor T3 corresponds to the inverting input of the amplifier element AE2. The non-inverting input, which is connected to the virtual ground terminal VG, is omitted in the driver stage DR of FIG. 2, wherein a virtual ground voltage is determined, for example, by the physical parameters of the driver transistor T3, e.g. by means of its threshold voltage.

Similar to the driver stage DR, the amplifier element AE1 of the output amplifier stage OA comprises a series connection of an n-channel field-effect transistor T2 and an output current source CSO coupled between the supply potential terminal VDD and the ground potential terminal GND. The connection between the transistor T2 and the output current source CSO is coupled to the control input of the output transistor T1 by means of a buffering inverter element INV.

In this embodiment, the output voltage at the signal output OUT is fed back to the comparison input CMP of the differential stage DIF for comparing it to a reference voltage VREF. As a comparison result, an output current or tail current at the comparison output COUT is generated which is fed as an input current to the driver stage DR. A respective driver voltage supported by a corresponding charging current is generated from the comparison current by means of the driver stage DR. In the output amplifier stage OA, the driver voltage is used to control the controllable path of the output transistor T1 such that the output voltage assumes a value according to the reference voltage. In other words, a control loop is formed by the feedback of the output voltage to the differential stage DIF. The amplifier arrangement shown in FIG. 2 can therefore also be regarded as a voltage regulator, in particular as a linear voltage regulator. In some embodiments the amplifier arrangement can be used as an LDO.

The feedback of the output voltage at the signal output OUT to the comparison input CMP can also comprise a resistive voltage divider in various embodiments. In this case the output voltage is provided as a multiple of the reference voltage VREF, as it is widely known for LDOs. Furthermore a level shift can be included in the feedback path.

Compared to a conventional voltage regulator in which the comparison current is used to directly charge the capacitive element CE of the capacitive compensation, the providing of a charging current by the driver stage DR, which is higher than the usually small comparison current, charging of capacitive element CE becomes faster. Therefore, especially in an initial startup phase of the arrangement, the capacitive element CE can be charged faster in order to achieve a steady state charging value or charging voltage, respectively.

The series connections of transistors T2, T3 with current sources CSO, CSD form common source stages which can easily be implemented. Preferably, the transistors T2, T3 are matched to each other, for example by a corresponding width-to-length ratio. Furthermore, the current provided by the driver current source CSD and the output current source CSO should be matched accordingly in this case. As a result, gate source voltages at transistors T2, T3 correspond to each other such that there is no voltage drop across the resistive feedback RF and no offset is generated in the arrangement.

If the amplifier arrangement shown in FIG. 2 is used as a low dropout regulator, a positive output voltage is generated. In this case, the driver stage DR generates a pull-down current for charging the capacitive element CE in response to the comparison current provided by the differential stage DIF.

If a negative voltage should be generated by a similar amplifier arrangement, respective p-channel field-effect transistors should be replaced by n-channel transistors, and vice-versa. In this case, the driver stage generates a pull-up current for changing the charging state of the capacitive element CE. A detailed explanation of a respective amplifier arrangement for generating a negative voltage is omitted here, as respective changes to be made are clear to a person of average skill in the art.

In a further embodiment, the resistors RD1, RD2 in the differential stage DIF can also be omitted, which increases the gain bandwidth product of the amplifier arrangement. As an alternative, small resistance values can be chosen for the resistors RD1, RD2 such that noise resulting from the resistors RD1, RD2 can be neglected.

Figure 3:
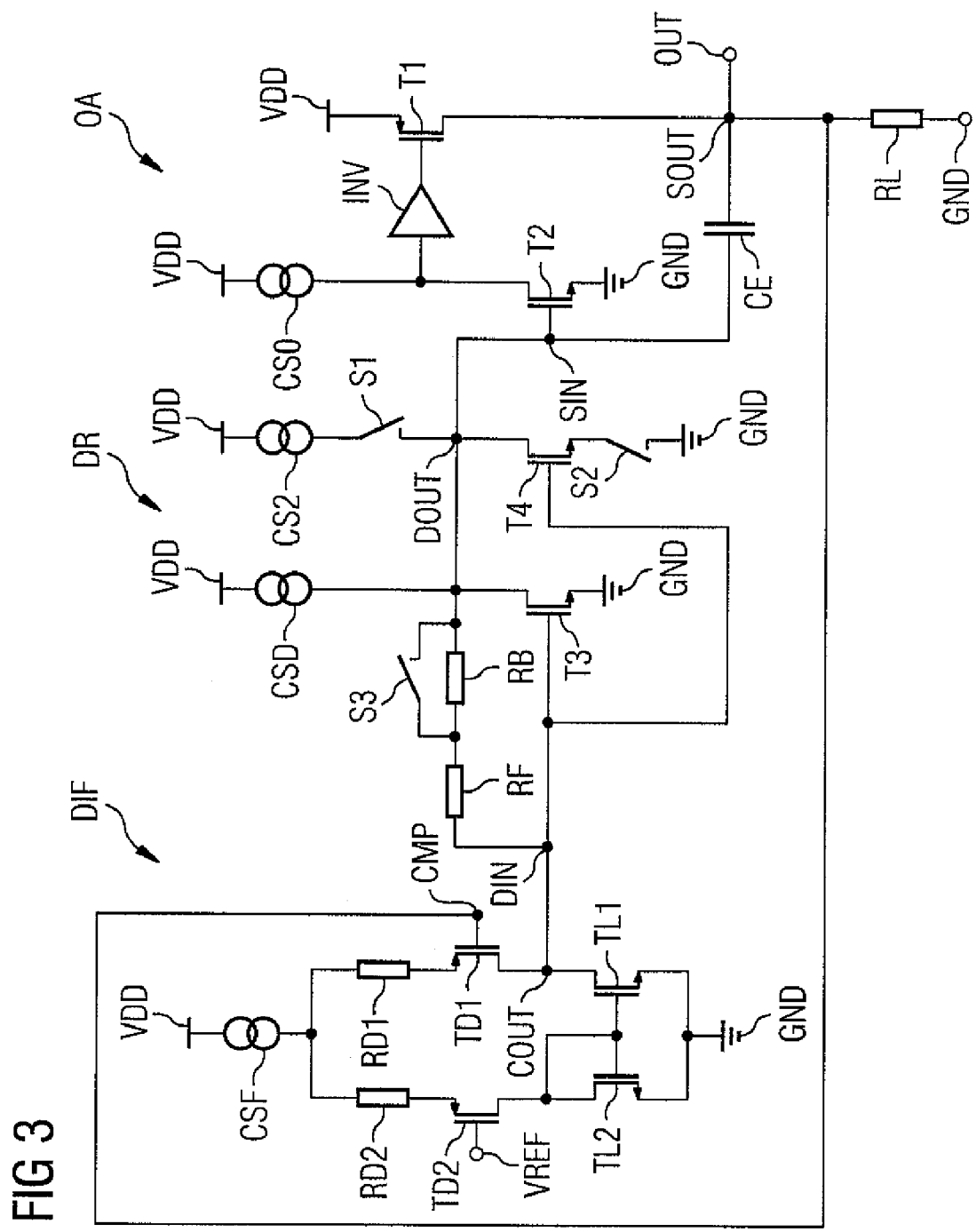
FIG. 3 shows a third exemplary embodiment of an amplifier arrangement.

FIG. 3 shows another embodiment of an amplifier arrangement which can be used as a voltage regulator or a low dropout regulator. The differential stage DIF and the output amplifier stage OA correspond to the respective stages shown in FIG. 2. In the driver stage DR, an additional series connection of a further driver transistor T4 and a further driver current source CS2 is provided which can be connected in parallel to the driver transistor T3 and the driver current source CS by switches S1, S2. Furthermore, an additional impedance element RB is connected in series to the impedance element RF, wherein the further impedance element RB can be bypassed by means of a switch S3. Preferably, the impedance element RF and the further impedance element RB comprise a resistive component, but can also comprise capacitive or inductive components.

In a startup phase of the arrangement, either the additional transistor T4 in current source CS2 or the additional impedance element RB can be activated by providing a respective activation signal to the switches S1, S2 or S3, respectively. Furthermore, as well the further impedance element RB and the transistor T4 and current source CS2 can be activated depending on the activation signal. In each case, the charging current provided at the driver output DOUT is increased such that charging of the capacitive element CE becomes faster and the startup time is reduced.

Preferably, the driver transistor T3 and the further driver transistor T4 are matched to each other, for example such that the further driver transistor T4 provides a higher current for the same control voltage at its input, determined, for example, by respective width-to-length ratio of the transistors T3, T4. Accordingly, also the current provided by the current sources CSD, CS2 should have the current ratio determined by the transistors T3, T4. In this case, a voltage at the driver output DOUT is maintained and only the charging current provided by the driver stage DR is increased.

The increasing of the resistance of the resistive feedback by the further impedance element RB leads to an increased gain bandwidth product proportionally to the increasing of the resistance. However, the charging current for charging the capacitive element CE changes in a quadratic way with respect to the increasing of the feedback resistance. Therefore, an adequate slew rate improvement can be achieved with a small variation of the gain bandwidth product. Furthermore, the increased gain bandwidth product is only effective during activation of the further impedance element RB.

By increasing the current drivability of the driver stage by activating the additional current source CS2 and the additional transistor T4, the gain bandwidth product basically remains unchanged for an improved slew rate.

The activation signal can be generated by a sensing circuit that determines whether or not the amplifier arrangement is in its steady state.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. An amplifier arrangement, comprising:
   a signal output;
   an output amplifier stage comprising:
      a stage input;
      a stage output coupled to the signal output;
      an output transistor;
      an amplifier element comprising:
         an input coupled to the stage input; and
         an output coupled to a control input of the output transistor, a controllable path of the output transistor coupled between a supply potential terminal and the stage output; and
      a capacitive element coupling the stage output to the stage input; and
   a driver stage comprising:
      a driver input; and
      a driver output coupled to the stage input, the driver stage configured to generate a voltage potential at the driver output depending on an input current at the driver input and to provide a charging current to the capacitive element being higher than the input current.

2. The amplifier arrangement according to claim 1, wherein the driver stage comprises a further amplifier element coupled between the driver input and the driver output and comprises an impedance based feedback.

3. The amplifier arrangement according to claim 1, wherein the driver stage comprises:
   a driver current source;

a driver transistor with a controllable path connected in series to the driver current source and with a control input coupled to the driver input; and an impedance element coupled between the driver input and the driver output;

wherein the series connection of the driver current source and the controllable path of the driver transistor is coupled between the supply potential terminal and a ground potential terminal, and a connection of the driver current source and the driver transistor is coupled to the driver output.

4. The amplifier arrangement according to claim 3,
wherein the driver stage further comprises:
a further driver current source connected in parallel to the driver current source in a switchable fashion depending on an activation signal; and
a further driver transistor connected in parallel to the driver transistor in a switchable fashion depending on the activation signal.

5. The amplifier arrangement according to claim 3,
wherein the driver stage comprises a further impedance element connected in series to the impedance element in a switchable fashion depending on a further activation signal.

6. The amplifier arrangement according to claim 3,
wherein the amplifier element of the output amplifier stage comprises:
an output current source matched to the driver current source;
a transistor being matched to the driver transistor, a controllable path of the transistor connected in series to the output current source and a control connection of the transistor coupled to the stage input; and
an inverter element coupled between the control input of the output transistor and a connection of the output current source and the transistor of the amplifier element;
wherein the series connection of the output current source and the controllable path of the transistor is coupled between the supply potential terminal and the ground potential terminal.

7. The amplifier arrangement according to claim 1, further comprising a differential stage comprising:
a reference input for providing a reference voltage;
a comparison input coupled to the signal output; and
a comparison output coupled to the driver input;
wherein the differential stage is configured to provide a comparison current at the comparison output depending on a comparison of a voltage at the comparison input and the reference voltage.

8. A signal generation method, comprising the steps of:
providing an output amplifier stage with an output coupled to its input via a capacitive element;
providing an input current;
generating a driver voltage depending on the input current, wherein generating the driver voltage includes providing a charging current to the capacitive element being higher than the input current; and
generating an output voltage depending on the driver voltage by means of the output amplifier stage,
wherein generating the output voltage comprises controlling a current through an output transistor which is coupled to a supply potential terminal as a function of the driver voltage.

9. The signal generation method according to claim 8,
wherein generating the driver voltage selectively comprises increasing the charging current depending on an activation signal.

10. The signal generation method according to claim 8,
wherein generating the driver voltage is based on an impedance feedback.

11. The signal generation method according to claim 10,
wherein generating the driver voltage selectively comprises increasing an impedance of the impedance feedback depending on a further activation signal.

12. The signal generation method according to claim 8,
wherein the input current is provided by comparing a voltage derived from the output voltage to a reference voltage.

* * * * *